(12) United States Patent
Li et al.

(10) Patent No.: US 12,078,583 B2
(45) Date of Patent: Sep. 3, 2024

(54) METHODS FOR CLASSIFYING PETROLEUM COKE

(71) Applicants: BP CORPORATION NORTH AMERICA INC., Naperville, IL (US); GREEN IMAGING TECHNOLOGIES, INC., Fredericton (CA)

(72) Inventors: Qiangyi Li, Naperville, IL (US); Christopher P. Eppig, St. Charles, IL (US); Derrick P. Green, Fredericton (CA)

(73) Assignees: BP Corporation North America Inc., Naperville, IL (US); Green Imaging Technologies, Inc., Fredericton (CA)

( * ) Notice: Subject to any disclaimer, the term of this patent is extended or adjusted under 35 U.S.C. 154(b) by 0 days.

(21) Appl. No.: 17/055,072

(22) PCT Filed: Jan. 17, 2019

(86) PCT No.: PCT/CA2019/050062
§ 371 (c)(1),
(2) Date: Nov. 12, 2020

(87) PCT Pub. No.: WO2019/140525
PCT Pub. Date: Jul. 25, 2019

(65) Prior Publication Data
US 2021/0223157 A1 Jul. 22, 2021

Related U.S. Application Data

(60) Provisional application No. 62/619,412, filed on Jan. 19, 2018.

(51) Int. Cl.
G01N 15/08 (2006.01)
G01N 1/28 (2006.01)
(Continued)

(52) U.S. Cl.
CPC ............ G01N 15/088 (2013.01); G01N 1/28 (2013.01); G01N 24/08 (2013.01); G01R 33/448 (2013.01)

(58) Field of Classification Search
CPC ...... G01R 33/448; G01N 1/28; G01N 15/088; G01N 24/08; C10B 55/00
See application file for complete search history.

(56) References Cited

U.S. PATENT DOCUMENTS 5,023,551 A 11/1991 Kleinberg
6,462,542 B1 7/2002 Venkataramanan
(Continued)

FOREIGN PATENT DOCUMENTS

JP 2002294250 A * 10/2002

OTHER PUBLICATIONS

John C. Edwards; A Review of Applications of NMR Spectroscopy in the Petroleum Industry; Chapter 16 in "Spectroscopic Analysis of Petroleum Products and Lubricants" © ASTM International; 2011.*
(Continued)

*Primary Examiner* — Jay Patidar
(74) *Attorney, Agent, or Firm* — Eugene Derenyi

(57) ABSTRACT

A method of determining the identity of a petroleum coke sample including obtaining a nuclear magnetic resonance (NMR) measurement of the sample, determining a relaxation decay value of a fluid in the sample from the NMR measurement, comparing the relaxation decay value to relaxation decay values of known petroleum coke materials in a reference group to determine whether the petroleum coke is one of the known materials.

15 Claims, 9 Drawing Sheets

(51) Int. Cl.
   *G01N 24/08* (2006.01)
   *G01R 33/44* (2006.01)

(56) References Cited

U.S. PATENT DOCUMENTS

| | | | |
|---|---|---|---|
| 6,883,702 | B2 | 4/2005 | Hurlimann |
| 7,034,528 | B2 | 4/2006 | Minh |
| 7,388,374 | B2 | 6/2008 | Minh |
| 9,139,781 | B2* | 9/2015 | Bernatz .............. C10G 9/005 |
| 2002/0179493 | A1 | 12/2002 | Etter |
| 2007/0068800 | A1 | 3/2007 | Edwards |
| 2014/0361774 | A1* | 12/2014 | Jensen .............. G01N 24/08 324/309 |
| 2015/0268323 | A1 | 9/2015 | Song et al. |

OTHER PUBLICATIONS

International Preliminary Report on Patentability for PCT/CA2019/050062 dated Jul. 21, 2020.
Edwards, John: A Review of Applications of NMR Spectroscopy in the Petroleum Industry, Chapter 16 in "Spectroscopic Analysis of Petroleum Products and Lubricants", ASTM International, 2011.
Supplementary European Search Report for EP19741253 dated Sep. 22, 2021.
Wang, Zongxian et al., Correlation of Temperature-Programmed Oxidation with Microscopy for Quantitative Morphological Characterization of Thermal Cokes Produced from Pilot and Commercial Delayed Cokers, Energy Fuels 2015, 29, 659-665.
Michel, D. et al., NMR of Petroleum Cokes I: Relaxation Studies and Quantitative Analysis of Hydrogen by Magnetic Resonance, Carbon, vol. 32, No. 1, pp. 31-40, 1994.
Morriss, Chris et al., Core Analysis by Low Field NMR, SCA-9404, Mar. 1, 1997, pp. 43-56.
Ellis, Paul et al., Tutorial: Delayed Coking Fundamentals, Mar. 9, 1998 Great Lakes Carbon Corporation.
Marsh, H. et al., Structure and formation of shot coke—a microscopy study., Journal of Materials Science 20 (1985) 289-302.
Siskin, M., Asphaltene Molecular Structure and Chemical Influences on the Morphology of Coke Produced in Delayed Coking, Energy and Fuels 2006, 20, 1227-1234.
Rodriguez, Joaquin et al., Evaluation of a delayed coking process by 'H and 13C n.m.r. spectroscopy: 1. Material balances, Fuel 1994 vol. 73 No. 12 pp. 1863-1869.
Butler, J.P., Estimating Solutions of First Kind Integral Equations With Nonnegative Constraints and Optimal Smoothing, Siam J. Numer. Anal. vol. 18, No. 3, Jun. 1981.
Cheng, H.N., Solid-state NMR and ESR studies of activated carbons produced from pecan shells, Carbon 48 (2010) 2455-2469.
Yao, Yanbin et al., Petrophysical characterization of coals by low-field nuclear magnetic resonance (NMR), Fuel 89 (2010) 1371-1380.
Brouwer, Eric et al., Magnetic Resonance Microimaging Studies of Porous Petroleum Coke, Studies in Surface Science and Catalysis 129 2000 Elsevier Science B.V., pp. 509-516.
Zhou, Sandong et al., Fractal characterization of pore-fracture in low-rank coals using a low-field NMR relaxation method, Fuel 181 (2016) 218-226.

* cited by examiner

METHODS FOR CLASSIFYING PETROLEUM COKE

TECHNICAL FIELD

This disclosure relates to the general subject of classification of petroleum coke.

BACKGROUND

Delayed coking is a thermal cracking process used in petroleum refineries to upgrade and convert high-boiling-range hydrocarbon residues into liquid and gas product streams, leaving behind solid carbonaceous material in the process' coke drums.

The solid coke material may have several different types of morphologies, depending upon the specific feedstock and coking conditions. Virgin petroleum residues (bottoms from atmospheric and vacuum distillation of crude oil) can produce cokes which can be classified as "sponge coke" (see for example P. Ellis, C. Paul, "Tutorial: Delayed Coking Fundamentals," AIChE 1998 Spring Meeting, New Orleans, La., Mar. 8-12, 1998, Paper 29a), "shot coke" (see for example H. Marsh, C. Calvert, J. Bacha, "Structure and Formation of Shot Coke-a Microscopic Study," J. of Materials Science 20 (1985) 289-302), "transition coke" (see for example M. Siskin, S. Kelemen, C. Eppig, L. Brown, M. Afeworki, "Asphaltene Molecular Structure and Chemical Influences on the Morphology of Coke Produced in Delayed Coking," Energy & Fuels 20 (2006) 1227-1234) and in some cases "dense coke" (see for example U.S. Pat. No. 9,139,781 "Delayed Coking Process"). In addition, highly aromatic oils such as FCC fractionator bottoms slurry oil will produce in delayed cokers what is known as "needle coke".

The physical structures and chemical properties of the petroleum coke determine the end use of the coke which can be burned as fuel, calcined for use in the aluminum, chemical, or steel industries, or gasified to produce steam, electricity, or gas feedstocks for the petrochemicals industry.

Commercial sales contracts for sponge coke which is destined to be calcined for use in the aluminum manufacturing industry normally specify key properties such as metals, sulfur, and volatile materials content. Because of adverse effects of shot coke in calcination-grade sponge coke, contracts normally also specify that there be zero shot coke present, or have substantial penalties for presence of any shot coke in the bulk product mixture. In these instances, there is need for quantitative determination of the fraction of shot coke which may be present in sponge coke.

The accuracy of existing testing methods for determining coke morphology can be "questionable". Attempts to increase testing accuracy have involved using larger samples but this has led to lengthened testing durations.

It is desired to have test methods for determining identity of petroleum coke that are both accurate and do not involve long testing durations.

SUMMARY

One aspect of the instant disclosure relates to a method of using hydrogen NMR measurements of a coke sample to measure the amount of hydrogen present in the sample. This measurement is a measurement of moisture content in the sample. The moisture is usually in the form of water but can be another NMR active fluid present in the pores and/or interstitial regions of the coke sample. Measurements of the moisture content are used to identify the coke sample for classification purposes.

Another aspect of the instant disclosure relates to a method of saturating a coke sample with a NMR active fluid (such as water) and examining the sample using NMR. The internal microstructures of different types of coke show different NMR measurement results. The coke sample is classified based on the NMR results.

Another aspect of the instant disclosure relates to a method wherein a coke sample is saturated with a NMR active fluid and then scanned in a NMR apparatus. The results of the scan are then used to determine the amount of various types of coke present in the sample as a percentage of the total amount of coke in the sample.

Another aspect of the instant disclosure relates to a method for quantitatively and rapidly determining physical morphologies of petroleum coke, including sponge, shot and dense-cokes, by infusing and saturating a representative coke sample with a NMR active fluid such as water, measuring the log mean $T_2$ log with a low field NMR instrument, and assigning the coke sample a morphology based on the measured log mean $T_2$. The sample may include more than one type of petroleum coke.

Another aspect of the instant disclosure relates to a method of determining the identity of a petroleum coke sample including obtaining a nuclear magnetic resonance (NMR) measurement of the sample, determining a relaxation decay value of a fluid in the sample from the NMR measurement, comparing the relaxation decay value to relaxation decay values of known petroleum coke materials in a reference group to determine whether the petroleum coke is one of the known materials.

DETAILED DESCRIPTION

Figure 1:
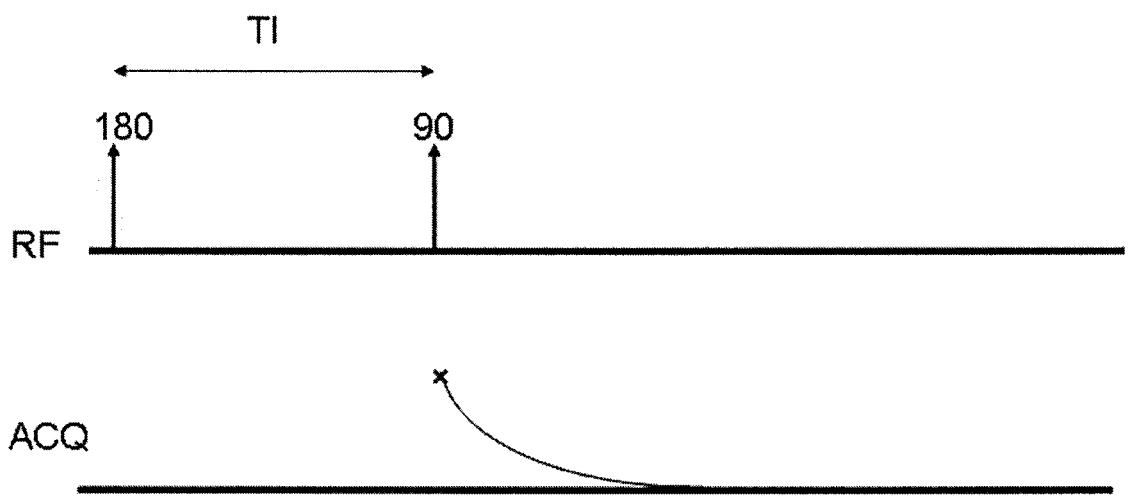
FIG. 1 illustrates a conventional NMR pulse diagram of a Carr-Purcell-Meilboom-Gill (CPMG) sequence usable in methods of the present disclosure, where RF represents radio frequency for a pulse, ACQ represents acquired in an acquired signal, 180 represents a 180° pulse and 90 represents a 90° pulse.

While this invention is susceptible of embodiment in many different forms, there is shown in the drawings, and will herein be described hereinafter in detail, some specific embodiments of the instant invention. It should be understood, however, that the present disclosure is to be considered an exemplification of the principles of the invention and is not intended to limit the invention to the specific embodiments or algorithms so described.

The present invention in one embodiment relates to a method of using NMR to investigate different internal structures (pore and interstitial regions) of different types of coke. The internal structures of a coke sample are filled with water (or other NMR active fluid) and the relaxation decay of the fluid is measured using NMR. The relaxation decay is directly affected by the internal structure of the coke sample.

The relaxation parameter used can be a $T_1$ or $T_2$ relaxation decay. The relaxation parameters $T_1$ and $T_2$ can be measured using a conventional NMR measurement pulse sequence. In certain embodiments, parameters of the sequence are selected to measure the range of $T_1$ or $T_2$ expected. The raw data is analyzed by fitting a sum of exponential as described by equation (1):

$$S(t) = \sum_{i=1}^{N} A(i) e^{-\frac{t}{T_2(i)}} \quad (1)$$

where $T_2^{(i)}$ is the list of $T_2$ values that are chosen to be fitted to; t is the time (for example, increments of 2*TAU can be used); A(i) is the amplitude or amount of signal at the $T_2^{(i)}$ value; i is the current $T_2$ value to fit to (for example, ~100 $T_2$ values log spaced between 0.01 ms and 10 sec can be used); and S(t) is the signal as a function of time.

This equation can be solved by minimizing equation (2):

$$\text{Error} = \sqrt{\sum_{t=TE}^{t=j*TE} \left( m(t) - \sum_{i=1}^{N} A(i) e^{-\frac{t}{T_2(i)}} \right)^2} + \alpha \sqrt{\sum_{i=1}^{N} A(i)^2} \quad (2)$$

where m(t) is the measured signal as a function of time; J is the echo number and the balance of the variables are as per equation (1).

The alpha or smoothing factor, $\alpha$, can be determine by a variety of methods (Butler 1981).

Figure 2:
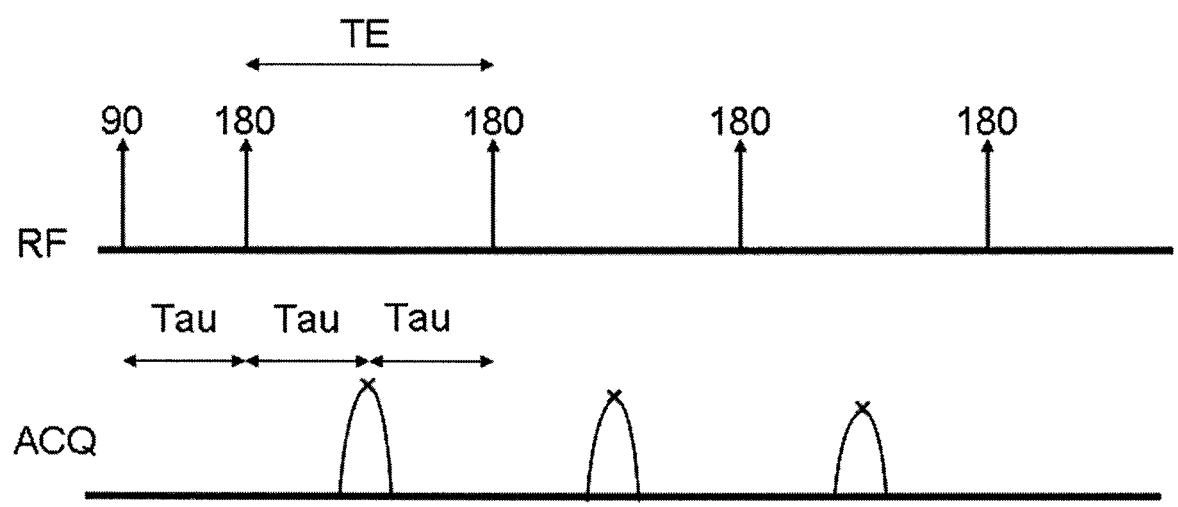
FIG. 2 illustrates a conventional NMR pulse diagram of an Inversion Recovery (IR) sequence usable in methods of the present disclosure, where TE represents echo time, RF represents radio frequency in a radio frequency pulse, ACQ represents acquired in an acquired signal, 180 represents a 180° pulse and 90 represents a 90° pulse.

In one embodiment, a conventional inversion recovery sequence, such as depicted in FIG. 1, is used to measure the $T_1$ relaxation decay. The inversion recovery sequence is repeated at different recovery times (TI) and the detected signal recovers with the relaxation constant of $T_1$. A conventional Carr-Purcell-Meilboom-Gill (CPMG) NMR pulse sequence, such as depicted in FIG. 2, can be used to measure $T_2$. In FIG. 2, the $T_2$ relaxation decay parameter is the decay of the acquired echoes (marked with x's) over time.

EXAMPLES

Figure 3:
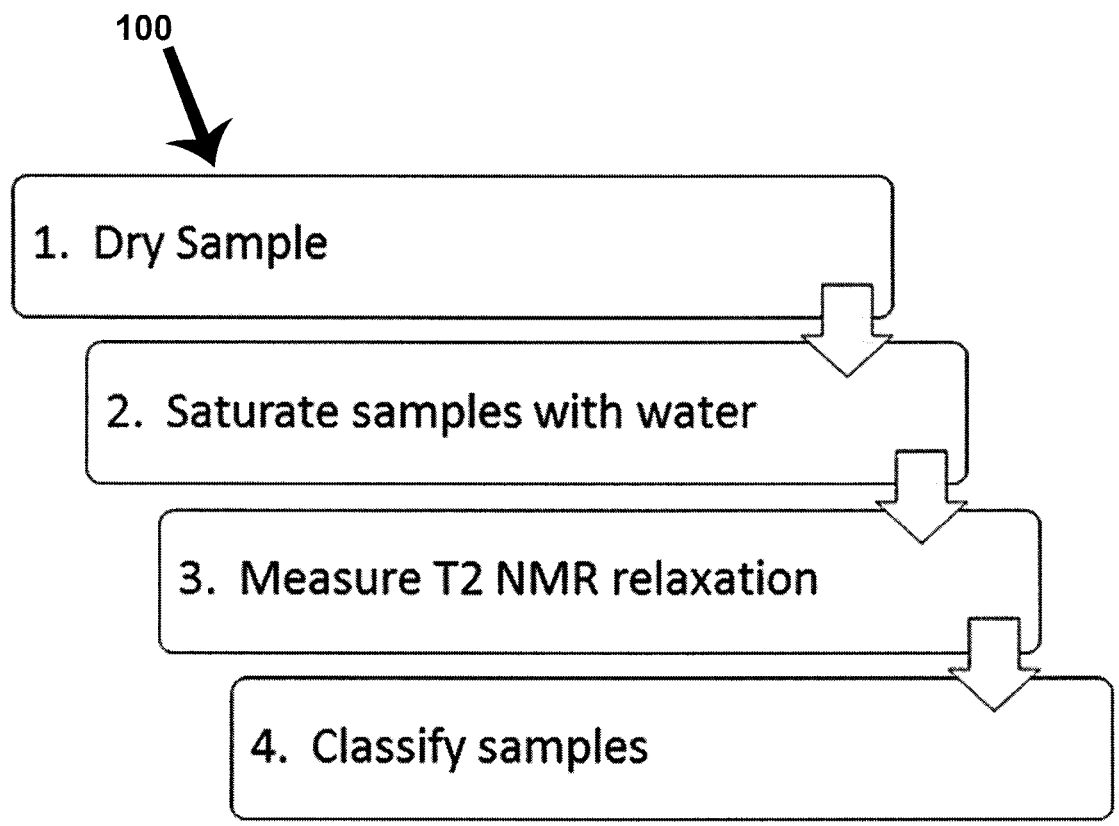
FIG. 3 is a flowchart depicting an example method for classifying coke.
Figure 4A:
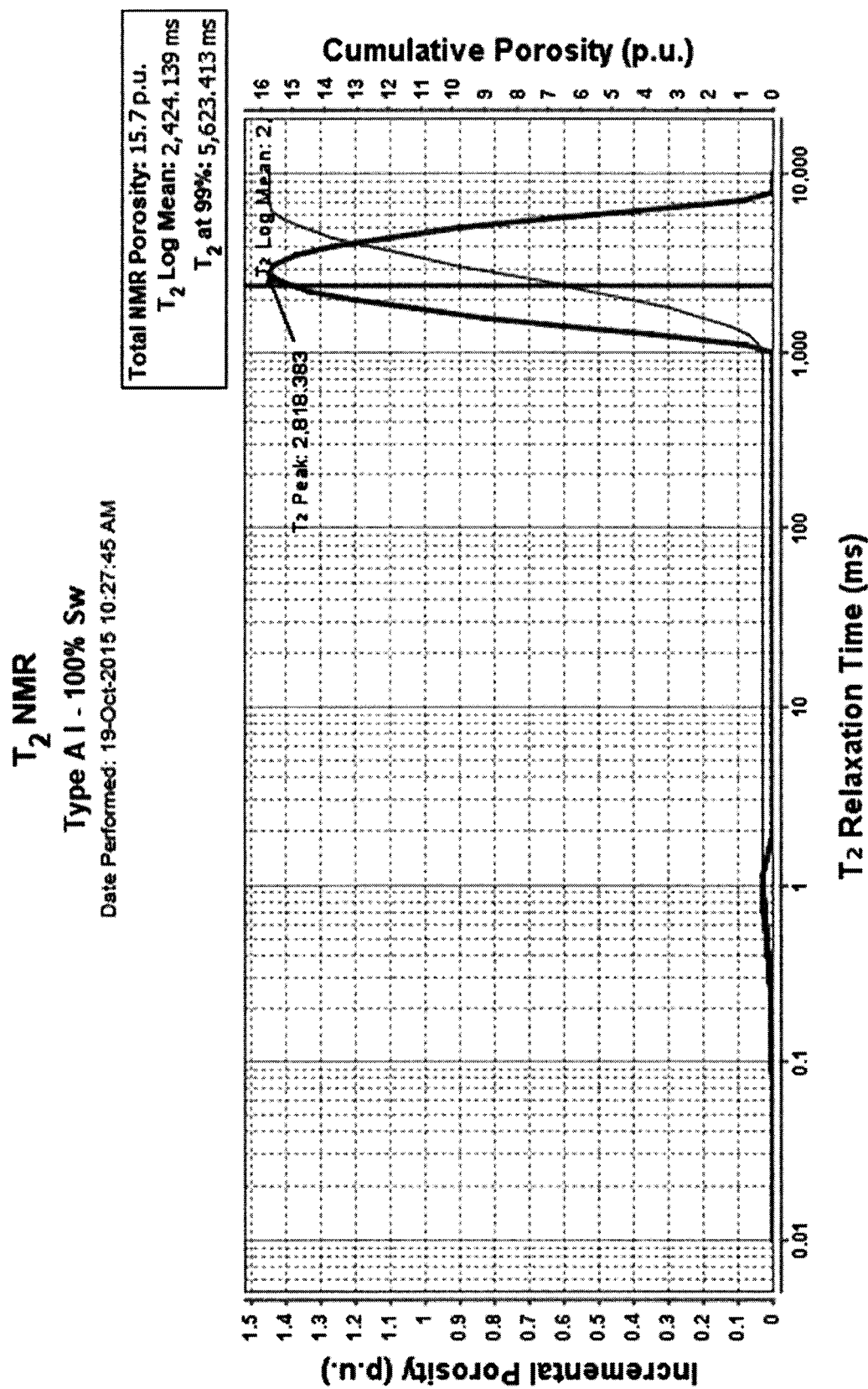
FIG. 4a is a graph illustrating the $T_2$ relaxation distribution for a first Type A coke sample.
Figure 4B:
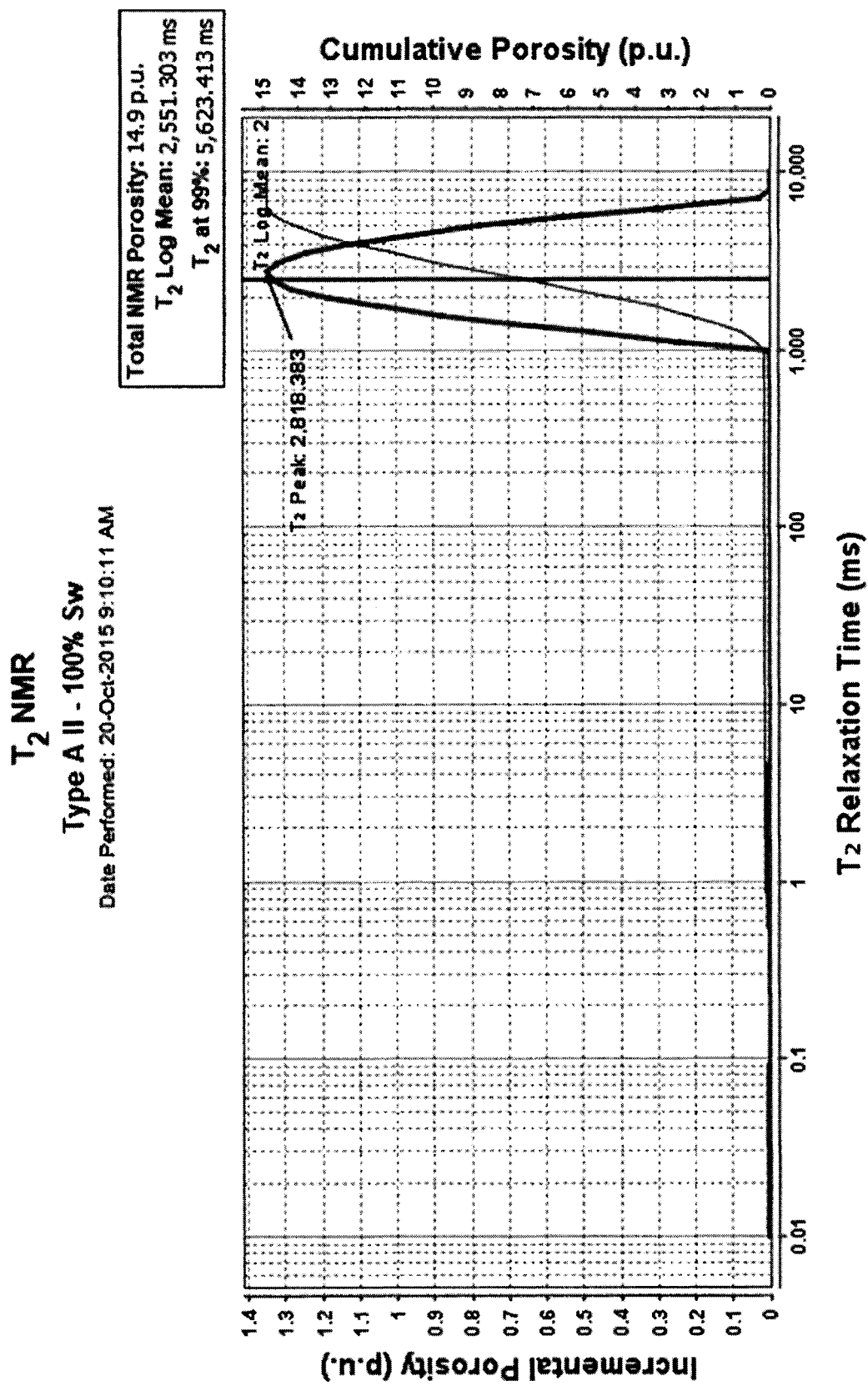
FIG. 4b is a graph illustrating the $T_2$ relaxation distribution for a second Type A coke sample.
Figure 4C:
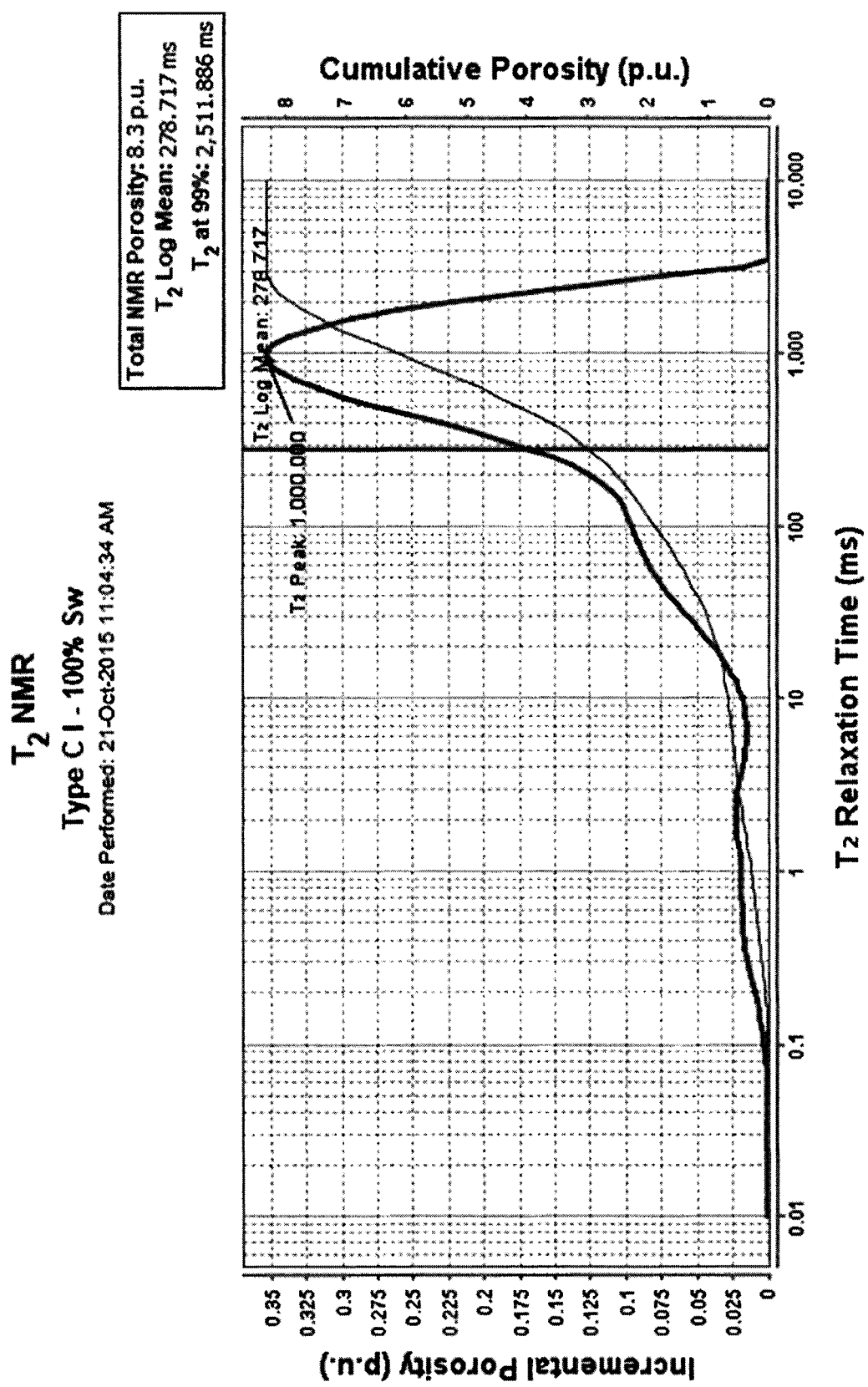
FIG. 4c is a graph illustrating the $T_2$ relaxation distribution for a first Type C coke sample.
Figure 4D:
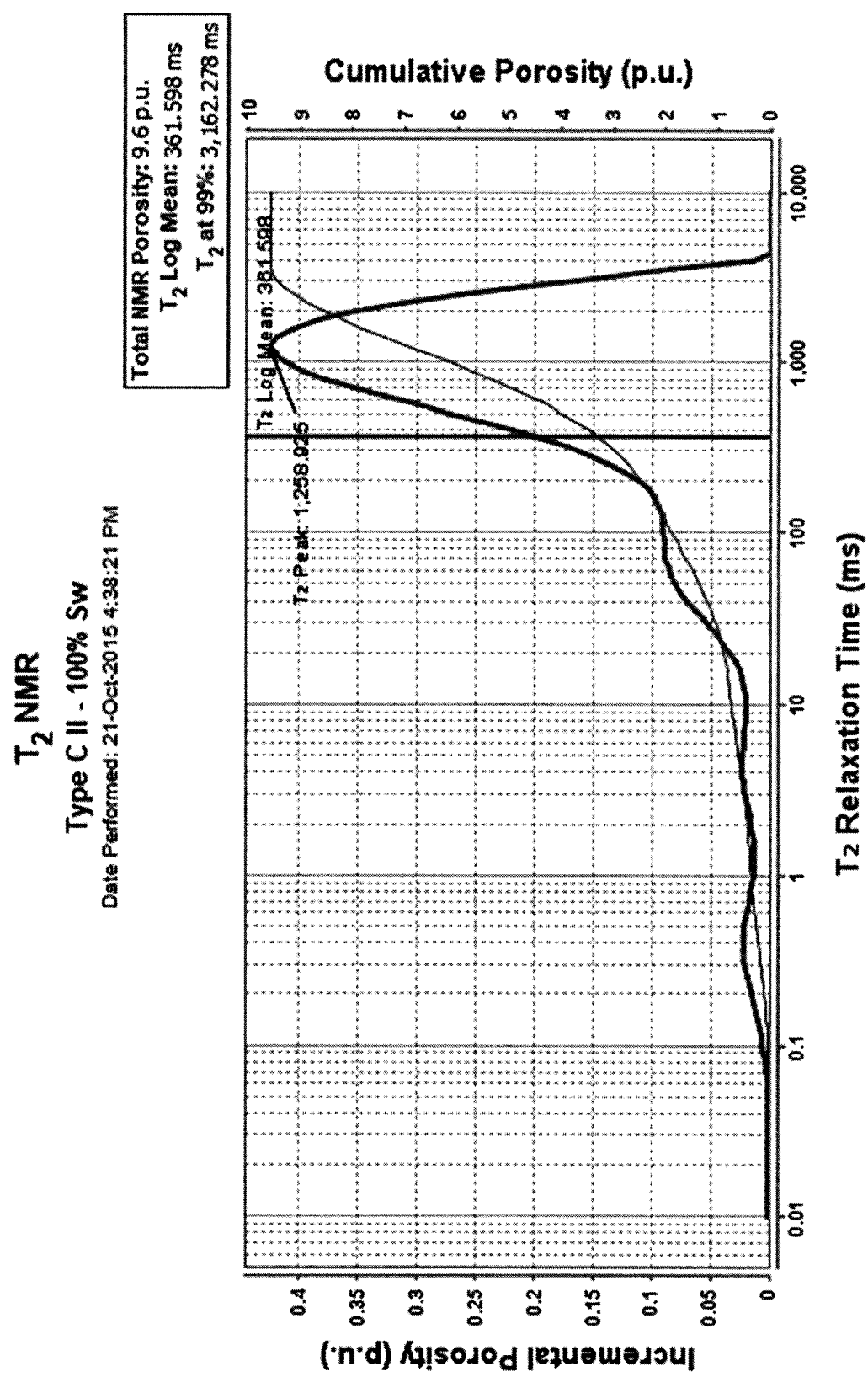
FIG. 4d is a graph illustrating the $T_2$ relaxation distribution for a second Type C coke sample.
Figure 4E:
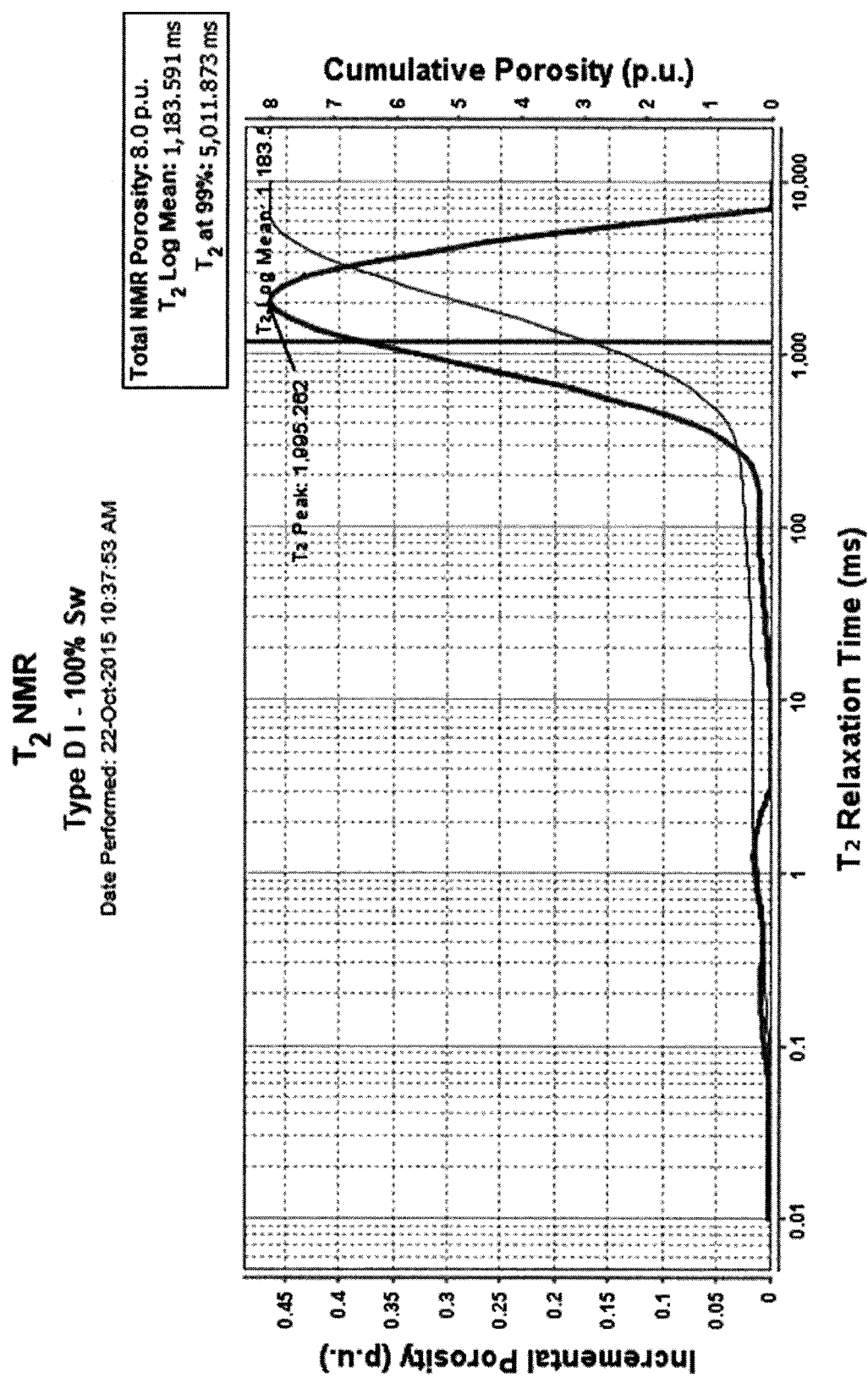
FIG. 4e is a graph illustrating the $T_2$ relaxation distribution for a first Type D coke sample.
Figure 4F:
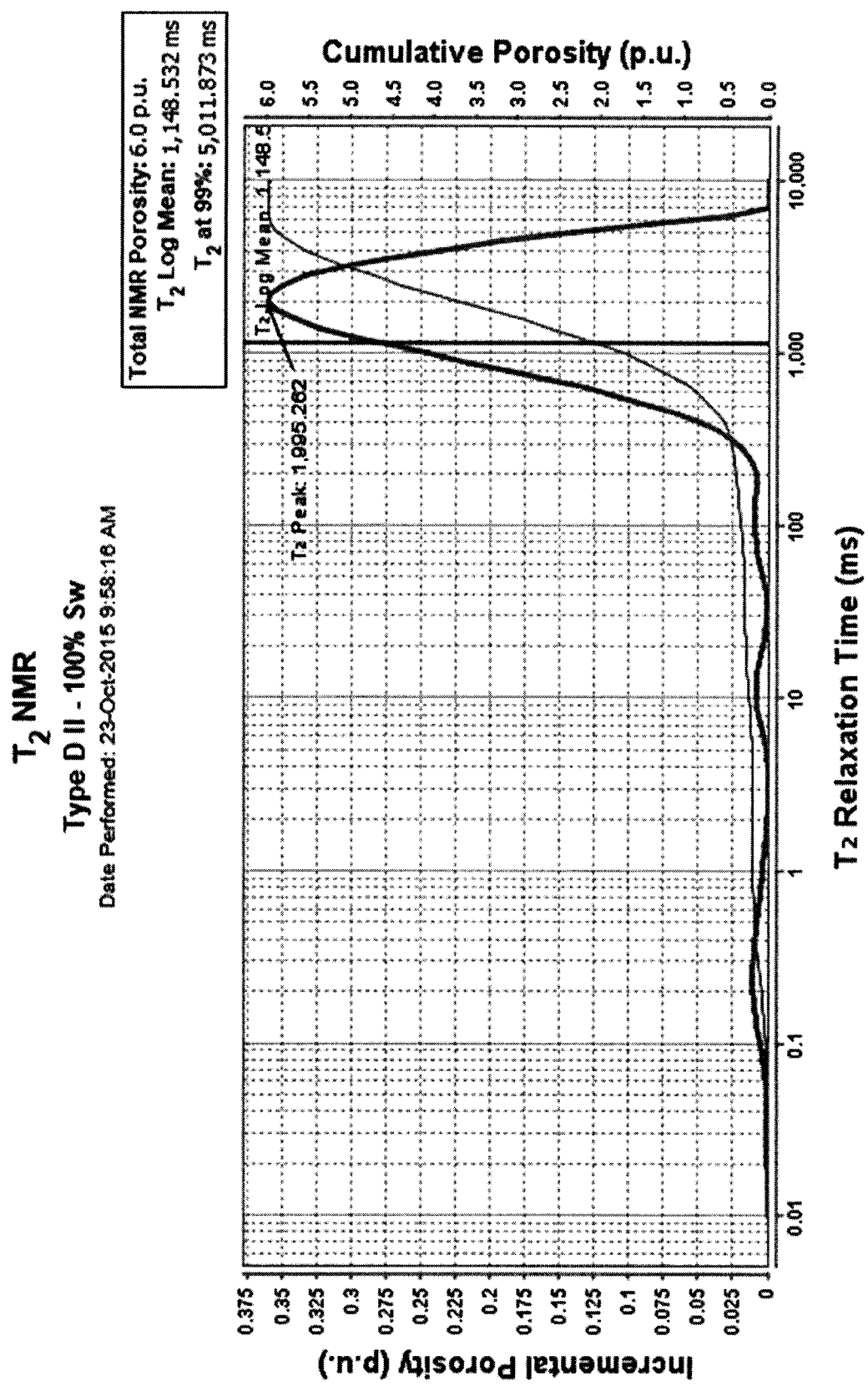
FIG. 4f is a graph illustrating the $T_2$ relaxation distribution for a second Type D coke sample.

Two samples (I and II) of three different types of coke (A, C and D) were tested using the exemplary method 100 illustrated in FIG. 3. In step 1, a coke sample is dried to remove fluid present in the sample. Step 1 is optional. In step 2, the coke sample is saturated with water by placing the sample under vacuum, introducing water to wet pores and interstitial regions of the sample and then releasing the vacuum. The vacuum created inside the sample facilitates the water to enter the pores and interstitial regions of the sample. It will be understood by those skilled in the art that other suitable sample wetting techniques can be used. In step 3, the $T_2$ relaxation decay of the sample is measured using a conventional NMR apparatus (not shown) programmed to apply a CPMG pulse sequence to samples. In step 4, the $T_2$ relaxation decay measurement is analyzed to obtain a $T_2$ relaxation decay parameter value. The $T_2$ relaxation decay parameter value is compared to known classification parameter values for coke types in a reference group of coke types to determine whether a known coke type is present in the sample tested. At this point, for example, results of the identification can be outputted. Step 4 can be implemented as computer-executable instructions in a computing environment (not shown). This could be as simple as classification based on the average to $T_2$ value. Or more complicated such as a fit to a mathematical equation using predetermined $T_2$ distribution of each COKE type. For example, the mathematical equation could be:

ERROR=measured $T_2$−(Type A $T_2$*weight A+Type B $T_2$*weight B+ . . . )

The " . . . " in the above equation is included to indicate that this type*weighting can be extended to the various types of coke which are to be classified. The computing environment can be integrated with the NMR apparatus of step 3 or can be separate.

FIG. 4 are graphs illustrating $T_2$ relaxation distributions for two samples of three different types of coke tested in this example. Differences in the porosity and the average $T_2$ value were observed for the different types of Coke samples. Table 1 lists the peak $T_2$ relaxation time, the average $T_2$ relaxation time (log mean), the maximum $T_2$ value, the NMR porosity, and the NMR porosity of the dry samples. The peak time is the $T_2$ time with the maximum intensity. The log mean is the $T_2$ time that divides the distribution into two equal areas (like an average). The NMR porosity is the total area under the distribution which is the total porosity of the water occupied pores (which at 100% saturation is all of them).

TABLE 1

| Sample Number | $T_2$ Peak (ms) | $T_2$ Log Mean (ms) | $T_2$ @ 99% (ms) | NMR Porosity (p.u.) | Dry NMR Porosity Contribution (p.u) |
|---|---|---|---|---|---|
| Type A I | 2818 | 2424 | 5623 | 15.7 | 0.062 |
| Type A II | 2818 | 2551 | 5623 | 14.9 | 0.077 |
| Type C I | 1000 | 279 | 2512 | 8.3 | 0.48 |
| Type C II | 1258 | 362 | 3162 | 9.6 | 0.51 |
| Type D I | 1995 | 1184 | 5012 | 8.0 | 0.095 |
| Type D II | 1995 | 1149 | 5012 | 6.0 | 0.14 |

Figure 5:
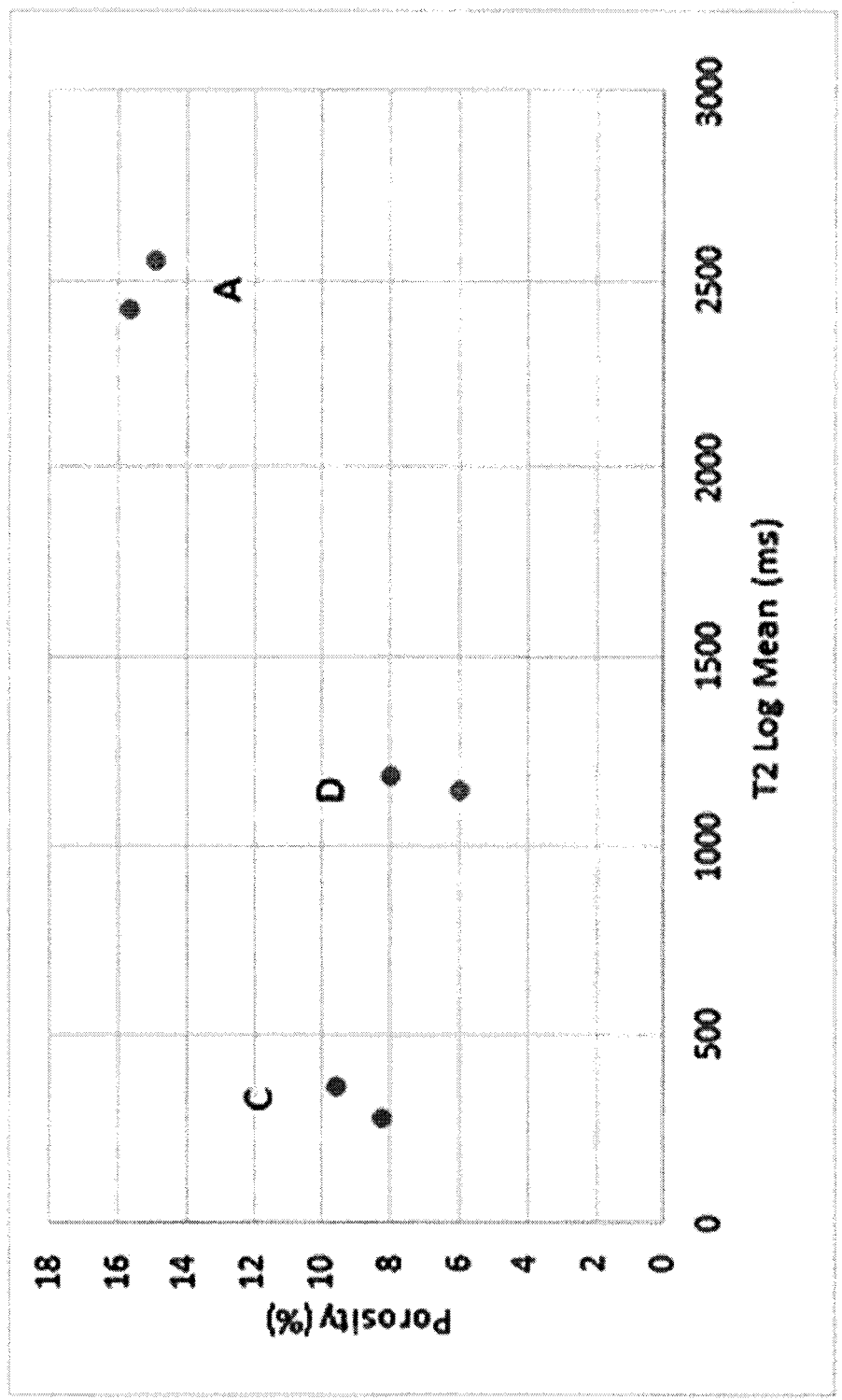
FIG. 5 is a plot of porosity versus the $T_2$ log mean of coke samples.

FIG. 5 is a plot comparison and differentiation of petroleum coke samples based on porosity versus $T_2$ log mean. Groupings for each coke type identified are shown.

In this example, three different types of coke were found to be present in the samples: Type A which was primarily sponge Coke, Type C which was primarily shot Coke and Type D which was primarily a denser Coke that is not that common.

In one embodiment, coke samples are classified by using a "cut-off" method which uses the $T_2$ log mean value. A sample is classified based on the range of $T_2$ log mean values that are measured. In certain embodiments, the $T_2$ log mean value range for each type of coke can be predetermined. For example, if the measured $T_2$ log mean is between 800 ms and 1500 ms, it is indicative of Type D coke.

In another embodiment, the above described "cut-off" method could use a $T_1$ log mean value instead of the $T_2$ log mean value.

In another embodiment, a second NMR parameter may be used in addition to a relaxation decay parameter. In certain embodiments, the second NMR parameter may be porosity. The use of $T_2$ log mean and porosity values allows for "zones" on a plot of porosity versus $T_2$ log mean to define the classification.

In another embodiment, the $T_2$ response of known classifications is measured and the sum each $T_2$ distribution with weightings is used to obtain the measured result on the unknown coke samples. This allows for a percentage of each classification (i.e. 50% Type A, 20% Type C and 30% type D).

In another example, a series petroleum coke samples with masses ranging from approximately 15 to 25 grams were vacuum saturated with 2% w/w KCl in water solution for a minimum of about 2 hours at ambient temperature. The samples were drained of free water and blotted with a paper towel to remove excess moisture. A given sample was loaded into a 40 mm diameter NMR tube and NMR measurements were performed at ambient temperature using an Oxford Instruments Geo Spec 2 NMR spectrometer operating at 2.36 MHz. The NMR measurements consisting of $T_2$ and $T_1$-$T_2$ spectra (bulk measurement) were performed with scan times ranging from 5 minutes to 5 hours depending upon the sample coke morphology and type of NMR measurement. Three types of cokes were tested: sponge, shot, and a dense coke produced from a Heavy Canadian vacuum residue. It was discovered that the log mean $T_2$ parameter could easily distinguish between the three types of coke morphologies, with sponge coke having a $T_2$ log mean (LM) of approximately 2500 ms; shot coke $T_2$ LM of about 320 ms; and dense coke having a $T_2$ of around 1150 ms.

What is claimed is:

1. A method of determining an identity of a petroleum coke sample comprising:
    obtaining a nuclear magnetic resonance (NMR) measurement of the sample, determining a relaxation decay value of a fluid in the sample from the NMR measurement, determining a porosity value of the sample from the relaxation decay value, comparing the porosity value to porosity values of known petroleum coke materials in a reference group to determine whether the petroleum coke is one of the known materials.

2. The method of claim 1, wherein the comparing step includes searching a list of known petroleum coke materials and corresponding porosity values.

3. The method of claim 1, wherein the known petroleum coke materials are selected from the group consisting of sponge-type coke, shot coke, transition coke, dense coke and needle coke.

4. The method of claim 1, further comprising outputting a result of the comparison step.

5. The method of claim 4, wherein the result is one of an identification of the sample as one of the known materials in the reference group or determination that the substance is not one of the known materials in the reference group.

6. The method of claim 1, wherein the relaxation decay value is T1 relaxation time or T2[.] relaxation time.

7. The method of claim 6, wherein the T1 relaxation time is the T1 log mean and the T2[.] relaxation time is the T2 log mean.

8. The method of claim 1, wherein the known petroleum coke materials are selected from the group consisting of sponge-type coke, shot coke, transition coke, dense coke and needle coke.

9. The method of claim 1, wherein the sample comprises at least two different known petroleum coke materials and the step of determining a relaxation decay value comprises determining at least two relaxation decay values of the fluid in the sample from the NMR measurement and comparing the relaxation decay values to relaxation decay values of the known petroleum coke materials in the reference group to determine whether the petroleum coke sample comprises one or more of the known materials.

10. The method of claim 9, further comprising determining weightings for the relaxation decay values to determine the percentage of types of known petroleum coke materials in the sample.

11. The method of claim 1, wherein the fluid is an NMR active fluid.

12. The method of claim 11, further comprising prior to the step of obtaining a low field nuclear magnetic resonance (NMR) measurement of the sample, saturating the sample with the NMR active fluid.

13. The method of claim 1, wherein the NMR measurement is a low field NMR measurement.

14. The method of claim 1, wherein the step of comparing the relaxation decay value includes fitting the relaxation decay value to a mathematical equation using a predetermined T2 distribution of each coke type to be classified.

15. The method of claim 14, wherein the mathematical equation is

ERROR=measured $T2$−(Type $A$ $T2$*weight $A$+Type $B$ $T2$*weight $B$+ . . . ).

* * * * *